United States Patent
Sugai

(10) Patent No.: US 7,439,780 B2
(45) Date of Patent: Oct. 21, 2008

(54) CHOPPER TYPE COMPARATOR

(75) Inventor: Danya Sugai, Tokyo (JP)

(73) Assignee: Oki Electric Industry Co., Ltd. (JP)

( * ) Notice: Subject to any disclaimer, the term of this patent is extended or adjusted under 35 U.S.C. 154(b) by 74 days.

(21) Appl. No.: 11/702,095

(22) Filed: Feb. 5, 2007

(65) Prior Publication Data

US 2007/0279103 A1    Dec. 6, 2007

(30) Foreign Application Priority Data

Jun. 6, 2006    (JP) .............................. 2006-156740

(51) Int. Cl.
*H03K 17/00* (2006.01)
(52) U.S. Cl. ..................... 327/124; 327/68; 327/70; 327/77; 327/90
(58) Field of Classification Search .............. 327/68, 327/70, 77, 90, 124
See application file for complete search history.

(56) References Cited

FOREIGN PATENT DOCUMENTS

| JP | 02111125 A | * | 4/1990 | .................. 341/155 |
| JP | 2005-057717 | | 3/2005 | |

* cited by examiner

*Primary Examiner*—Kenneth B. Wells
*Assistant Examiner*—Brandon S Cole
(74) *Attorney, Agent, or Firm*—Studebaker & Brackett PC; Donald R. Studebaker

(57) ABSTRACT

A comparator includes: a CMOS inverter constituted by a combination of a first p-channel MOS transistor and a first n-channel MOS transistor; a second p-channel MOS transistor connected in parallel to the first p-channel MOS transistor in an analog input period, and disconnected from the first p-channel MOS transistor in a comparison period; and a second n-channel MOS transistor connected in parallel to the first n-channel MOS transistor in the analog input period, and disconnected from the first n-channel MOS transistor in the comparison period.

5 Claims, 3 Drawing Sheets

CHOPPER TYPE COMPARATOR

BACKGROUND OF THE INVENTION

1. Field of the Invention

The present invention relates to a chopper type comparator used for an analog-to-digital converter, etc.

2. Description of the Related Art

FIG. 2 is a circuit diagram of a conventional chopper type comparator disclosed in Japanese Patent Application Kokai No. 2005-57717.

The chopper type comparator includes: a switch 1 for connecting and disconnecting between a terminal to which a reference voltage VREF is supplied and a node NA; and a switch 2 for connecting and disconnecting between a terminal to which an analog signal VIN is supplied and the node NA. The node NA is connected through a capacitor 3 to an input (a node NB) of an inverter circuit 4. An output (a node NC) of the inverter circuit 4 is connected through a capacitor 5 to an input (a node ND) of an inverter circuit 6. Further, the input NB of the inverter circuit 4 is connected through a switch 7 to the output NC of the inverter circuit 4. The input ND of the inverter circuit 6 is connected through a switch 8 to an output terminal of the inverter circuit 6. An output signal indicating a comparison result OUT is output from the output terminal of the inverter circuit 6.

The inverter circuits 4 and 6 have the same configuration, in each of which two gated inverters are connected in parallel. A gated inverter is an inverter having a current-controlling transistor inserted in series with source and ground lines thereof. The inverter circuits 4 and 6 are arranged so that the current-controlling transistors of the gated inverters are controlled in their conducting states by control voltages X and Y.

The typical operation of the chopper type comparator is as follows.

In an input period of the analog signal VIN, the switch 1 stays OFF, and the switches 2, 7 and 8 become ON. Thus, the potential of the node NA becomes VIN. The potentials of the nodes NB and NC become VT4, VT4 being a threshold voltage of the inverter circuit 4. Further, the potential of the node ND becomes VT6, which is a threshold voltage of the inverter circuit 6. In this case, charges Q3 and Q5 stored in the capacitors 3 and 5 are given by:

$$Q3=C3\times(VIN-VT4) \quad (1)$$

$$Q5=C5\times(VT4-VT6) \quad (2)$$

where capacitances of the capacitors 3 and 5 are denoted by C3 and C5, respectively.

Then, the switch 2 is turned off. After that, the switches 7 and 8 are turned off, and further the switch 1 is turned on. At this time, when the potential of the node NB is represented by VB, the charge Q3a of the capacitor 3 is given by:

$$Q3a=C3\times(VREF-VB) \quad (3)$$

Here, Q3a=Q3, since the charge of the capacitor 3 does not change. Therefore, from the equations (1) and (3), the potential VB can be expressed as follows.

$$VB=VREF-VIN+VT4 \quad (4)$$

When the voltage gain of the inverter circuit 4 is represented by A4, the potential VC of the node NC is given by:

$$VC=A4-(VREF-VIN)+VT4 \quad (5)$$

Further, when the potential of the node ND is represented by VD, the charge Q5a of the capacitor 5 is given by:

$$Q5a=C5\times(VD-VD) \quad (6)$$

Here, Q5a=Q5, since the charge of the capacitor 5 does not change. Therefore, from the equations (2), (5) and (6), the potential VD becomes as follows.

$$VD=A4\times(VREF-VIN)+VT6 \quad (7)$$

Further, when the voltage gain of the inverter circuit 6 is represented by A6, an output signal OUT output from the inverter circuit 6 is given by:

$$OUT=A4\times A6\times(VREF-VIN)+VT6 \quad (8)$$

Accordingly, the chopper type comparator operates as an amplifier that amplifies a potential difference (VREF−VIN) between the reference voltage VREF and analog signal VIN by a factor of A4×A6. Then, the output signal OUT which is the result of comparison can be obtained.

Meanwhile, the chopper type comparator shown in FIG. 2 incorporates the inverter circuits 4 and 6 which use gated inverters. Accordingly, the voltage gains A4 and A6 of the inverter circuits 4 and 6 can be arbitrarily controlled by control voltages X and Y. Thus, the following are made possible: to make a high-speed comparison using an increased gain when a high resolution is required; and to reduce power consumption by decreasing the gain when a high resolution is not required.

However, the above-described chopper type comparator has had a problem such that through current of the inverter circuits is increased when operating at a high speed.

SUMMARY OF THE INVENTION

It is an object of the invention to provide a chopper type comparator in which through current of inverter circuits can be reduced thereby to reduce power consumption even when the comparator is operated at a high speed.

A chopper type comparator of the present invention includes: a first switch for supplying a first voltage to a first node in an analog input period; a second switch for supplying a second voltage to the first node in a comparison period; a capacitor connected between a second node and the first node; an inverter which inverts and amplifies a voltage of the second node and outputs it to a third node, and a third switch for short-circuiting between the second and third nodes in the analog input period; the inverter constituting a CMOS inverter constituted by a combination of a first p-channel MOS transistor, hereinafter referred to as "PMOS," and a first n-channel MOS transistor, hereinafter referred to as "NMOS"; a second PMOS connected in parallel to the first PMOS in the analog input period, and disconnected from the first PMOS in the comparison period; and a second NMOS connected in parallel to the first NMOS in the analog input period, and disconnected from the first NMOS in the comparison period.

In accordance with the present invention, a second PMOS and a second NMOS are provided in parallel to a PMOS and an NMOS of a CMOS inverter constituting an inverting amplifier, and the second PMOS and NMOS are connected in parallel to the CMOS inverter in the analog input period. This increases the driving capacity of the inverter in the analog input period, and therefore the potentials of the second and third nodes can be set at the threshold potential of the inverter rapidly. Further, as the second PMOS and NMOS are disconnected from the inverter in the comparison period, the power consumption is reduced. This has the following effects. The first is a high-speed operation can be executed. The second is the through current of the inverter circuit can be lessened thereby to reduce the power consumption.

DETAILED DESCRIPTION OF THE INVENTION

The above-described and other objects of the present invention and novel features thereof will be apparent more completely by reading the description of the preferred embodiments below with reference to the accompanying drawings. However, the drawings are intended for description only, and the scope of the invention is not limited thereto.

First Embodiment

Figure 1:
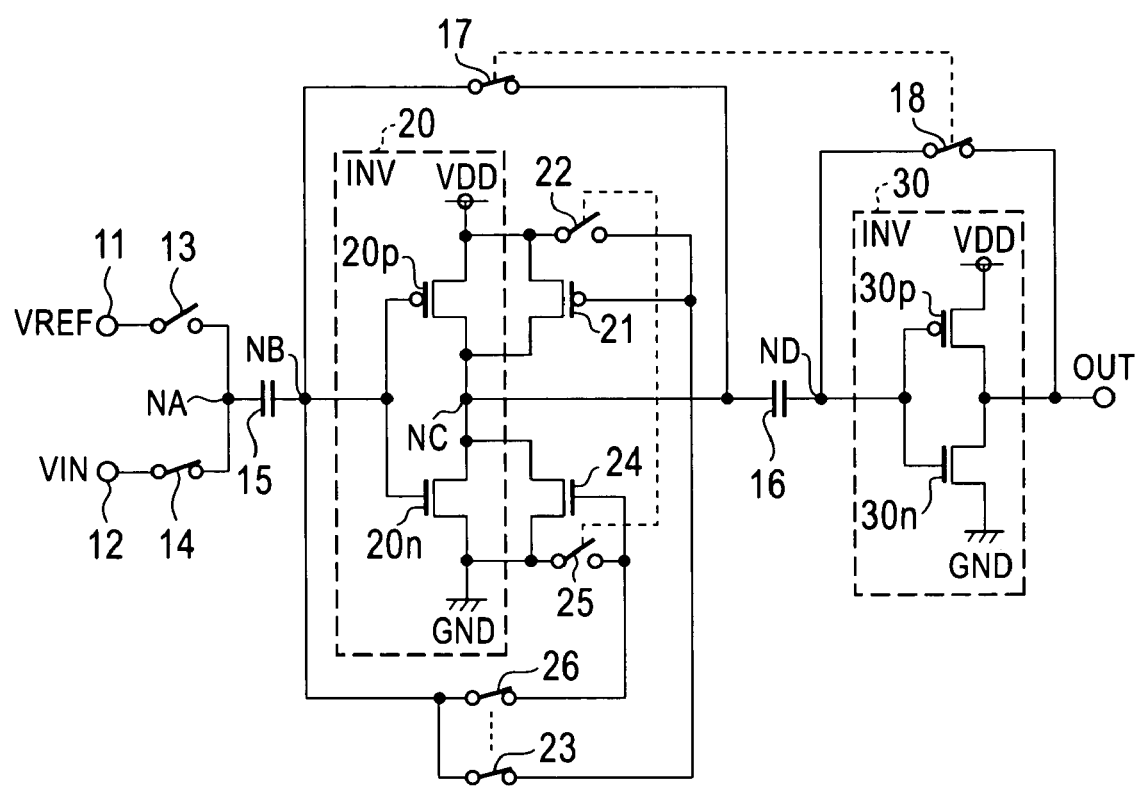
FIG. 1 is a circuit diagram of a chopper type comparator in accordance with a first embodiment of the invention.
Figure 2:
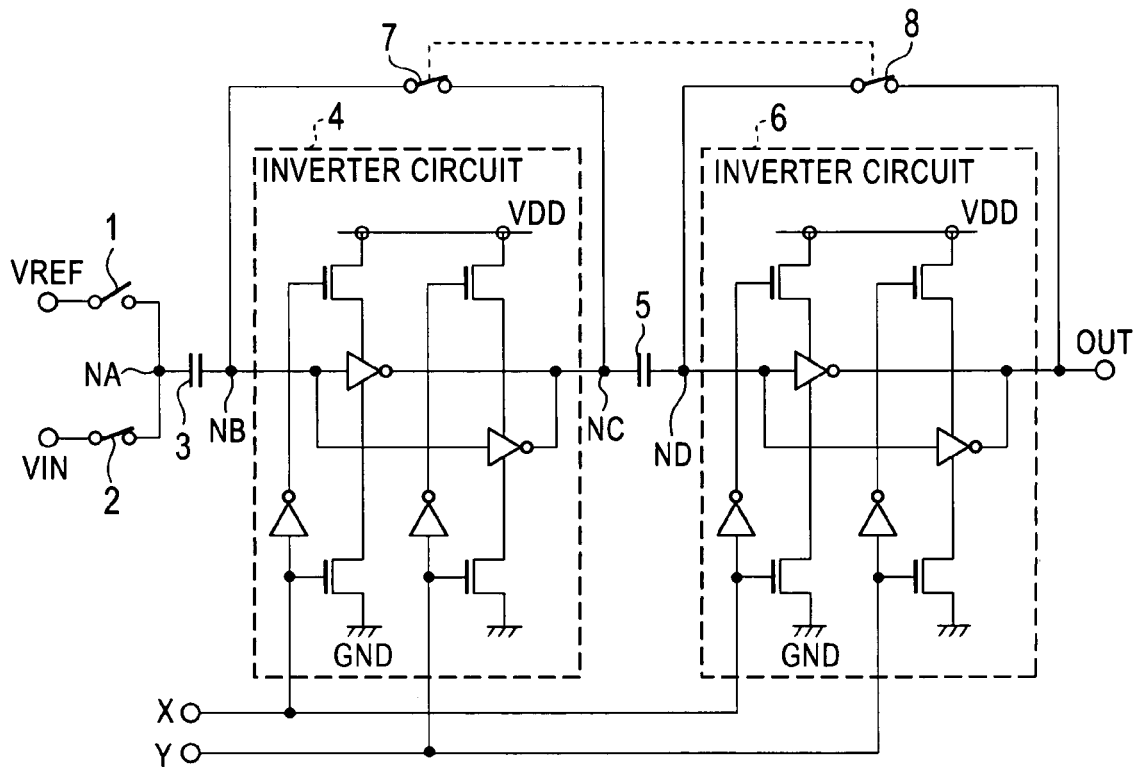
FIG. 2 is a circuit diagram of a conventional chopper type comparator.

FIG. 1 is a circuit diagram of a chopper type comparator according to a first embodiment of the present invention.

The chopper type comparator includes a terminal 11 for receiving a reference voltage VREF and a terminal 12 for receiving an analog signal VIN. The terminals 11 and 12 are connected to a node NA through switches 13 and 14, respectively. The node NA is connected to an input (a node NB) of an inverter (INV) 20 through a capacitor 15. An output (a node NC) of the inverter 20 is connected to an input (a node ND) of an inverter 30 through a capacitor 16. Further, the input NB of the inverter 20 is connected to the output NC of the inverter 20 through a switch 17. The input ND of the inverter 30 is connected to an output terminal of the inverter 30 through a switch 18. Therefore, an output signal OUT indicating a comparison result is output from the output terminal of the inverter 30.

In the inverter 20, a PMOS 20p is connected between the node NC on the output side thereof and a power-supply potential (or, supply potential) VDD, and an NMOS 20n is connected between the node NC and a ground potential GND. The inverter 20 is a typical CMOS inverter whose node NB on the input side is connected to the gates of the PMOS 20p and the NMOS 20n. Likewise, the inverter 30 is a typical CMOS inverter having a PMOS 30p connected between the inverter output and the supply potential VDD and an NMOS 30n connected between the inverter output and the ground potential GND with the gates of the PMOS 30p and NMOS 30n connected to the node ND at the inverter input.

The chopper type comparator further includes a PMOS 21 and an NMOS 24, which are provided in parallel to the inverter 20. Specifically, a source and a drain of the PMOS 20p of the inverter 20 are connected to a source and a drain of the PMOS 21, respectively. The source of the PMOS 21 is connected to a gate thereof through a switch 22. Also, the gate of the PMOS 21 is connected to the node NB through a switch 23.

Further, a source and a drain of the NMOS 20n of the inverter 20 are connected to a source and a drain of the NMOS 24, respectively. The source of the NMOS 24 is connected to a gate thereof through a switch 25. Also, the gate of the NMOS 24 is connected to the node NB through a switch 26.

The switches 13, 14, 17, 18, 22, 23, 25 and 26 are controlled between ON and OFF states by a timing control section, which is not shown in the drawing. Particularly, pairs of the switches 17 and 18, of the switches 22 and 25, and of switches 23 and 26 are respectively controlled to be turned on/off together or ganged controlled.

Figure 3:
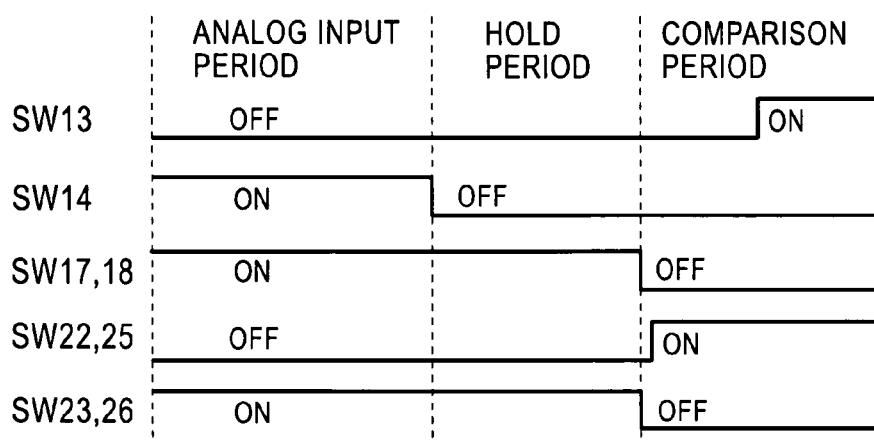
FIG. 3 is an illustration illustrating the operations of the chopper type comparator shown in FIG. 1.

FIG. 3 illustrates the operation of the chopper type comparator shown in FIG. 1, showing sequences for ON-OFF switching of the switches shown in FIG. 1. The operations of the comparator shown in FIG. 1 will be described below with reference to FIG. 3.

As shown in FIG. 3, in a first analog input period, the switches 14, 17, 18, 23 and 26 are turned on; and the switches 13, 22 and 25 are turned off. As a result, the PMOS 21 and the NMOS 24 are connected in parallel to the PMOS 20p and NMOS 20n of the inverter 20, respectively. In addition, the potential of the node NA becomes VIN, and the potentials of the nodes NB and NC are made VT20 (here, VT20 is a threshold voltage of an inverter circuit constituted of the inverter 20, the PMOS 21 and the NMOS 24). Further, the potential of the node ND is made VT30, where the VT30 is a threshold voltage of the inverter 30.

In the subsequent hold period, the switch 14 is turned off. As a result, the node NA is disconnected from the terminals 11 and 12, and therefore the charge stored in the capacitor 15 is held as it is.

Further, in a comparison period, the switches 17, 18, 23 and 26 are turned off in the first half thereof, and subsequently the switches 22 and 25 are turned off. As a result, the PMOS 21 and the NMOS 24 are brought in the OFF states, and disconnected from the inverter 20. In the latter half of the comparison period, the switch 13 is turned on. As a result, the potential difference (VREF−VIN) between the reference voltage VREF and the analog signal VIN is amplified by the inverters 20 and 30. Then, the inverter 30 outputs a comparison result output signal OUT.

As stated above, in the chopper type comparator in accordance with the first embodiment, the PMOS 21 and the NMOS 24 are connected to the inverter 20 in parallel through the switches 22, 23, 25 and 26. Further, the chopper type comparator is arranged so that the PMOS 21 and the NMOS 24 are made to operate in the analog input period and the hold period, whereas the PMOS 21 and the NMOS 24 are disconnected in the comparison period.

Thus, in the analog input period and the hold period, the potential of the node NB can be set to the threshold voltage VT20 of the inverter 20 within a predetermined time period by passing a predetermined amount of current through the inverter circuit configured by the inverter 20, the PMOS 21 and the NMOS 24. In contrast, since in the comparison period the PMOS 21 and NMOS 24 are disconnected from the inverter 20, the through current can be reduced. Accordingly, the comparator has the advantage that the power consumption thereof can be reduced while the high-speed operation is maintained.

Second Embodiment

Figure 4:
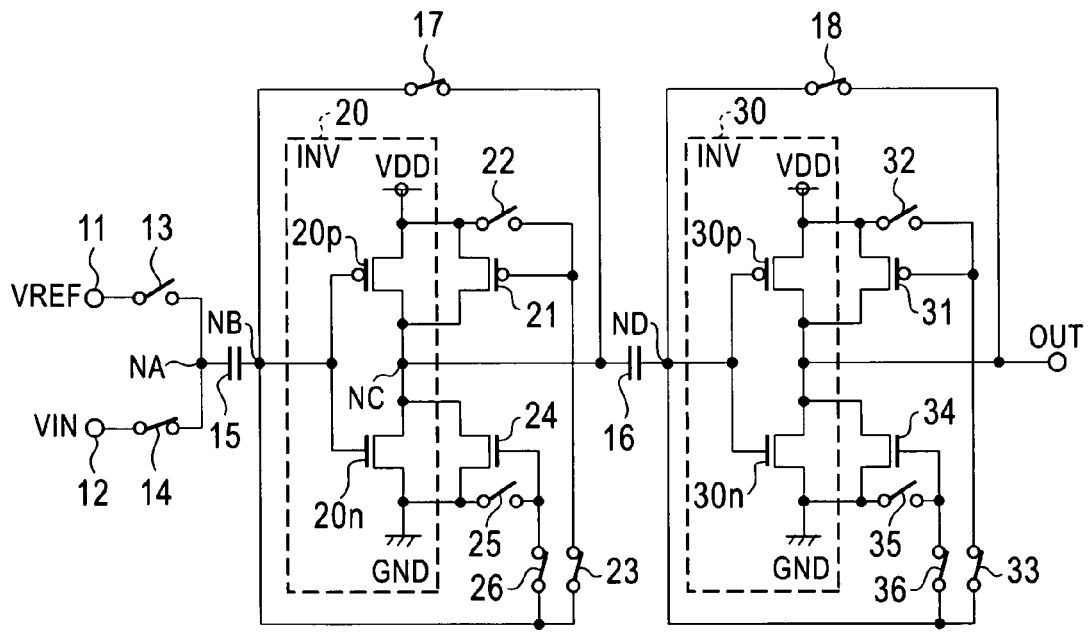
FIG. 4 is a circuit diagram of a chopper type comparator, in accordance with a second embodiment of the present invention.

FIG. 4 is a circuit diagram, showing a chopper type comparator according to a second embodiment of the present invention, in which like parts are identified by the same reference numerals as those in FIG. 1.

The chopper type comparator includes a PMOS 31 and an NMOS 34, which are connected in parallel to the a PMOS 30p and an NMOS 30n in the inverter 30 shown in FIG. 1 through switches 32, 33, 35 and 36 in the same manner as in the case of the inverter 20. The connection configuration of the PMOS 31 and the NMOS 34 with respect to the inverter 30 is the same as those of the PMOS 21 and the NMOS 24 with respect to the inverter 20.

In the chopper type comparator, the switches 32 and 35 are controlled between ON and OFF states with the same timings as those for the switches 22 and 25 and in the same manner. The switches 33 and 36 are controlled between ON and OFF states with the same timings as those for the switches 23 and 26 and in the same manner. Other operations are the same as those described with reference to FIG. 1.

As stated above, the chopper type comparator according to the second embodiment is arranged so that the PMOS 31 and the NMOS 34 are connected in parallel to the inverter 30 through switches 32, 33, 35 and 36, in addition to the similar arrangement with the inverter 20. The PMOS 31 and NMOS 34 are made to operate in an analog input period and a hold period, and are disconnected from the inverter in a comparison period.

Hence, this comparator has the advantage that the through current during a comparison period can be reduced even more than in the chopper type comparator in accordance with the first embodiment.

The invention is not limited to the above-described embodiments, and various modifications and changes may be made. The following are part of such modifications, for instance.

[Modification A]

Figure 5:
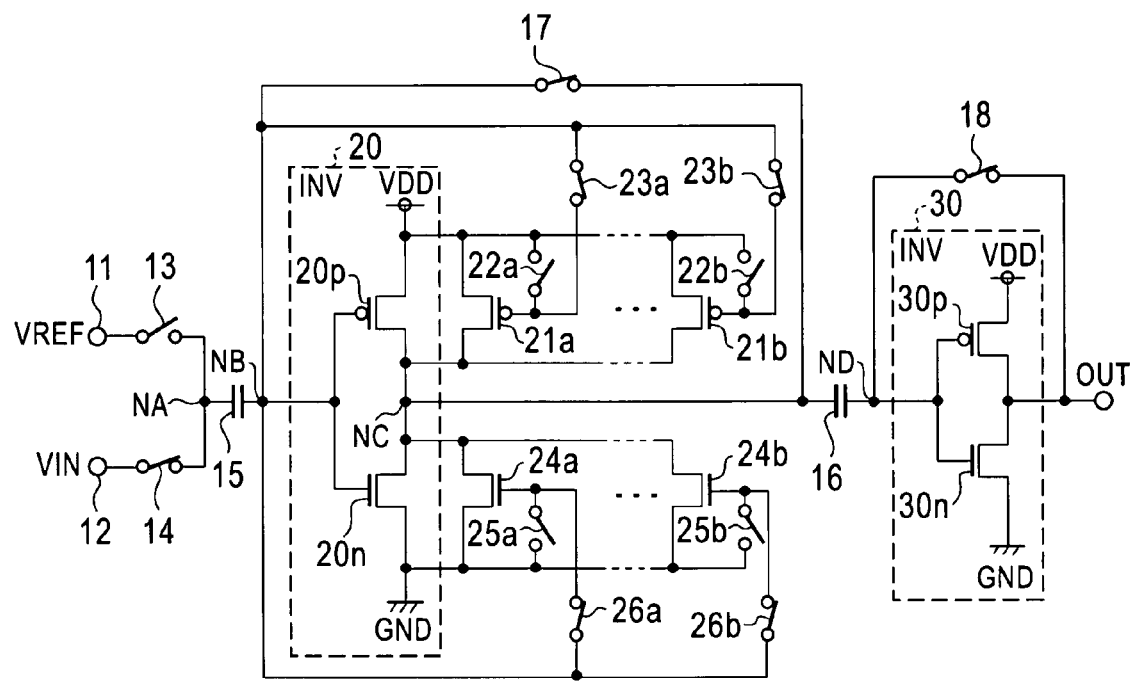
FIG. 5 is a circuit diagram of a chopper type comparator in accordance with another embodiment of the present invention.

FIG. 5 is a circuit diagram of a chopper type comparator in accordance with another embodiment of the present invention.

In this chopper type comparator, the inverter 20 shown in FIG. 1 has a PMOS 20p connected with two or more PMOSs 21a, 21b, and so on, and an NMOS 20n connected with two or more NMOSs 24a, 24b, and so on. The comparator is arranged so that the operations of the PMOSs 21a, 21b, . . . and NMOSs 24a, 24b, . . . are controlled by switches. As a result, the through current can be regulated to a more adequate value. It is noted that circuits similar to those connected to the inverter 20 can be also added to the inverter 30.

[Modification B]

The analog signal VIN is supplied to the node NA during the analog input period, and the reference voltage VREF is supplied to the node during a comparison period. However, conversely the reference voltage VREF may be supplied during the analog input period and the analog signal VIN may be supplied during the comparison period.

[Modification C]

While in the above embodiments, a chopper type comparator has two stages of inverters connected in a two-stage cascade through a capacitor, the invention is not limited to the two stages of inverters. In other words, one stage of inverter is sufficient as long as the inverter has a sufficient voltage gain. Also, three or more stages of inverters may be used.

[Modification D]

In the above description explains operations divided into three periods: an analog input period, a hold period and a comparison period. However, for the purpose of increasing the operation speed, the hold period needs be made as short as possible within a range where a switching operation can be performed reliably. That is, it is not necessary to set a separate hold period, as long as the switching operation is performed reliably.

The above-described switches including, for example, the switches 13, 14, 17, 18, 22, 23, 25 and 26 may be configured to receive switching control signals from an external circuit so as to perform switching in accordance with the control signals. In another instance, the switches may be configured to be controlled by a control section (not shown), provided internally or externally. Additionally, for example, the above-described periods (i.e., the analog input period, the hold period and the comparison period) can be set by the control section, and the switching of the switches may be performed in accordance with the periods and the timings described above-described embodiments.

The invention has been described above focusing on the preferred embodiments. It should be understood by those skilled in the art that various modifications and changes are expected, and such modifications and changes are all considered to fall in the scope of the claims.

This application is based on Japanese Patent Application No. 2006-156740 which is hereby incorporated by reference.

What is claimed is:

1. A chopper type comparator, comprising:
   a first switch for supplying a first voltage to a first node in an analog input period;
   a second switch for supplying a second voltage to the first node in a comparison period;
   a capacitor connected between a second node and the first node;
   an inverter which inverts and amplifies a voltage of the second node and outputs the voltage to a third node, the inverter being configured as a CMOS inverter including a combination of a first p-channel MOS transistor and a first n-channel MOS transistor;
   a third switch for short-circuiting between the second and the third nodes in the analog input period;
   a second p-channel MOS transistor which is connected in parallel to the first p-channel MOS transistor in the analog input period, and disconnected from the first p-channel MOS transistor in the comparison period; and
   a second n-channel MOS transistor which is connected in parallel to the first n-channel MOS transistor in the analog input period, and disconnected from the first n-channel MOS transistor in the comparison period.

2. The chopper type comparator according to claim 1, wherein the second p-channel MOS transistor and the second n-channel MOS transistor are each composed of two or more transistors connected in parallel.

3. A chopper type comparator, comprising:
   a first switch for supplying an analog signal voltage to a first node;
   a second switch for supplying a reference voltage to the first node;
   a CMOS inverter for inverting an input voltage, the CMOS inverter including a first p-channel MOS transistor and a first n-channel MOS transistor;
   a capacitor connected between the first node and an input node of the CMOS inverter;
   a third switch for short-circuiting between an output node and the input node of the CMOS inverter;
   a second p-channel MOS transistor and a second n-channel MOS transistor which are connected in parallel to the first p-channel MOS transistor and the first n-channel MOS transistor, respectively; and
   a fourth switch for disconnecting the second p-channel MOS transistor and the second n-channel MOS transistor from the first p-channel MOS transistor and the first n-channel MOS transistor, respectively.

4. The chopper type comparator according to claim 3, further comprising at least one p-channel MOS transistor and at least one n-channel MOS transistor, which are connected in parallel to the second p-channel MOS transistor and the second n-channel MOS transistor, respectively,
   wherein the fourth switch disconnects the second p-channel MOS transistor, the second n-channel MOS transistor, the at least one p-channel MOS transistor and the at least one n-channel MOS transistor from the first p-channel MOS transistor and the first n-channel MOS transistor.

5. The chopper type comparator according to claim 3, each of the first through fourth switches includes a receiving portion to receive a switching control signal to perform switching in accordance with the switching control signal.

* * * * *